United States Patent
Akiyama et al.

(10) Patent No.: US 9,684,014 B2
(45) Date of Patent: Jun. 20, 2017

(54) PROBER FOR INSPECTING SEMICONDUCTOR DEVICES FORMED ON SEMICONDUCTOR WAFER

(71) Applicant: Tokyo Electron Limited, Tokyo (JP)

(72) Inventors: Shuji Akiyama, Nirasaki (JP); Kazuya Yano, Nirasaki (JP); Isamu Inomata, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 164 days.

(21) Appl. No.: 14/619,279

(22) Filed: Feb. 11, 2015

(65) Prior Publication Data

US 2015/0226767 A1 Aug. 13, 2015

(30) Foreign Application Priority Data

Feb. 13, 2014 (JP) ................... 2014-025579

(51) Int. Cl.
*G01R 1/073* (2006.01)
(52) U.S. Cl.
CPC ..... *G01R 1/07314* (2013.01); *G01R 1/07364* (2013.01)
(58) Field of Classification Search
CPC .......... G01R 1/07314; G01R 1/07364
USPC .................. 324/756.03
See application file for complete search history.

(56) References Cited

U.S. PATENT DOCUMENTS

| 4,892,455 A * | 1/1990 | Hine | H01L 21/68 |
| | | | 414/416.03 |
| 7,547,181 B2 * | 6/2009 | Fukatsu | H01L 21/67051 |
| | | | 414/609 |
| 2003/0160401 A1 * | 8/2003 | Kang | H01L 21/67259 |
| | | | 279/133 |
| 2009/0237100 A1 * | 9/2009 | Namiki | G01R 31/2887 |
| | | | 324/756.03 |

FOREIGN PATENT DOCUMENTS

| JP | 59-072146 A | 4/1984 |
| JP | 07-297242 A | 11/1995 |
| JP | 4971416 B2 | 4/2012 |

* cited by examiner

*Primary Examiner* — Billy Lactaoen
(74) *Attorney, Agent, or Firm* — Pearne & Gordon LLP

(57) ABSTRACT

A prober can suppress a decrease of a throughput in inspection of semiconductor devices on a substrate. The prober 10 includes a stage 11 having a horizontal mounting surface 11a that mounts thereon a wafer W on which semiconductor devices are formed; a probe card 16 provided to face the stage 11; three roller devices 26, each having a vertical rotational shaft, equally-spaced along a circumference of the mounted wafer W. Each roller device 26 is configured to rotate the wafer W on a horizontal plane while being in contact with a peripheral edge of the wafer W.

7 Claims, 11 Drawing Sheets

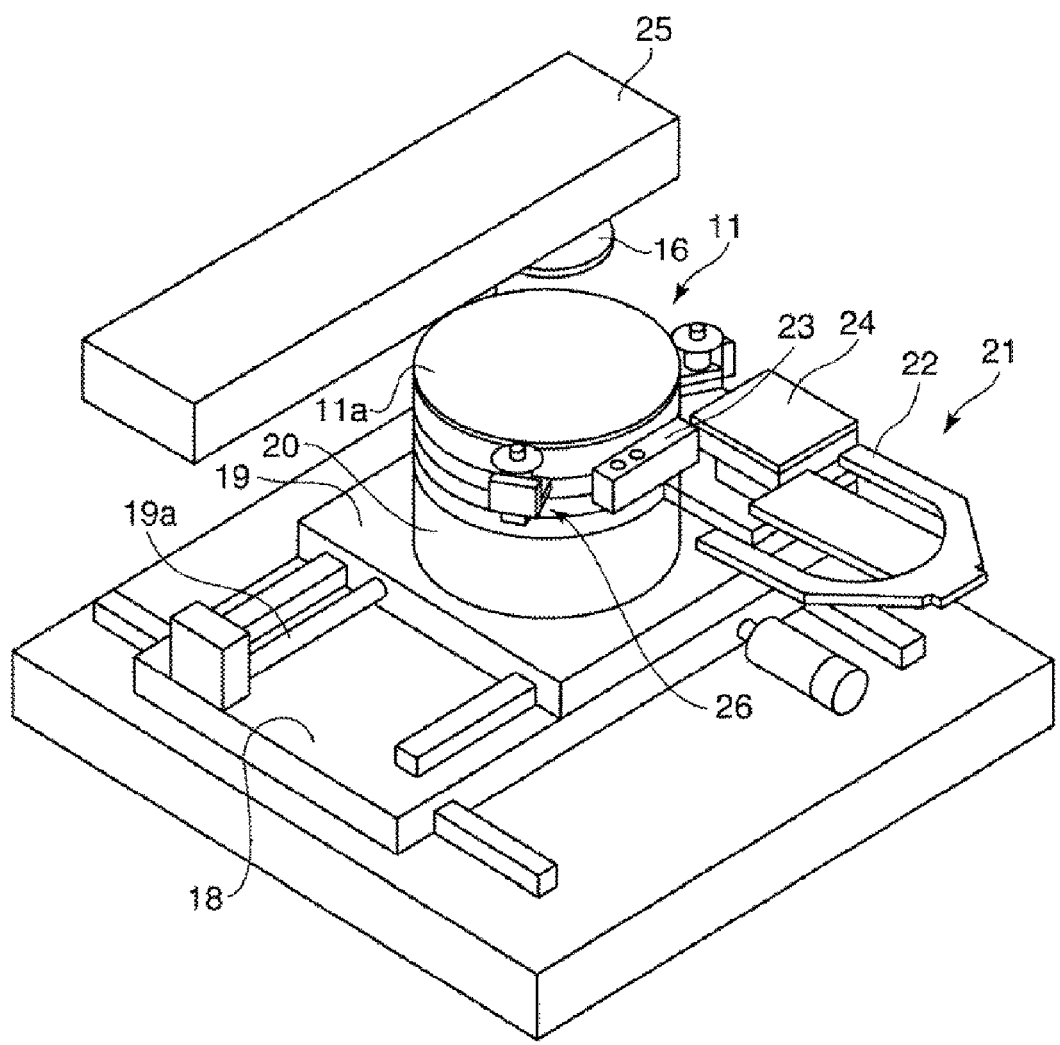
FIG. 2
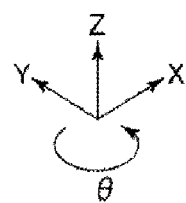

US 9,684,014 B2

PROBER FOR INSPECTING SEMICONDUCTOR DEVICES FORMED ON SEMICONDUCTOR WAFER

CROSS-REFERENCE TO RELATED APPLICATION

This application claims the benefit of Japanese Patent Application No. 2014-025579 filed on Feb. 13, 2014, the entire disclosures of which are incorporated herein by reference.

TECHNICAL FIELD

The embodiments described herein pertain generally to a prober that inspects semiconductor devices formed on a semiconductor wafer.

BACKGROUND

A prober is known as a substrate inspection apparatus that inspects electrical characteristics of semiconductor devices such as a power device or a memory formed on a semiconductor wafer (hereinafter, simply referred to as "wafer") as a substrate.

The prober includes a circular plate-shaped probe card 121 (see FIG. 12) having a multiple number of probe needles 120; and a stage which is moved in a vertical direction and a horizontal direction while mounting the wafer thereon. As the stage mounting the wafer thereon is moved toward the probe card 121, the probe needles 120 are allowed to come into contact with electrode pads or solder bumps of the semiconductor devices. In this state, by allowing an electric current for inspection to be flown to the electrode pads or the solder bumps through the probe needles 120, the electrical characteristics of the semiconductor devices are inspected (see, for example, Patent Document 1).

When inspecting the electrical characteristics of the semiconductor devices, multiple kinds of inspections may be performed on the semiconductor devices by using the same probe card 121. In such a case, electrodes pads 130 to be brought into contact with the probe needles 120 are changed by rotating a wafer W by, e.g., 180° on a horizontal plane (hereinafter, this rotation is will be referred to as "horizontal rotation"), as shown in FIG. 13A and FIG. 13B.

Conventionally, the stage is structured to be rotatable horizontally. A rotating device of the stage is implemented by a sliding device using a ball screw. Since the stage is rotated by the movement of a nut as a slider screw-coupled to the ball screw, a horizontal rotation amount of the stage is limited to a movement amount of the nut, only ±7° to ±8° (see, for example, Patent Document 2). Thus, the wafer W cannot be rotated horizontally by 180°.

For the reason, to rotate the wafer W horizontally by 180°, the wafer W is separated from the stage and is horizontally rotated by a rotating table provided in a loader of the prober. Then, the rotated wafer W is mounted on the stage again.

Patent Document 1: Japanese Patent Laid-open Publication No. H07-297242

Patent Document 2: Japanese Patent Publication No. 4971416

However, when rotating the wafer W horizontally by the rotating table within the loader, the wafer W need not moved between the stage and the rotating table, so that the throughput in the inspection of the semiconductor devices are decreased.

SUMMARY

In view of the foregoing problems, example embodiments provide a prober capable of suppressing a decrease of a throughput in the inspection of semiconductor devices of a substrate.

In one example embodiment, a prober includes a stage having a horizontal mounting surface that mounts thereon a substrate on which semiconductor devices are formed; a probe card provided to face the stage; and at least one roller, having a vertical rotational shaft, arranged on a circumference of the stage. Further, the at least one roller is configured to rotate the substrate on a horizontal plane while being in contact with a peripheral edge of the substrate.

In another example embodiment, a prober includes a circular plate-shaped stage, having a horizontal mounting surface that mounts thereon a substrate on which semiconductor devices are formed, configured to be rotated on a horizontal plane; a probe card provided to face the stage; and at least one roller, having a vertical rotational shaft, arranged on a circumference of the stage. Further, the at least one roller is configured to rotate the stage on the horizontal plane while being in contact with a peripheral edge of the stage.

In yet another example embodiment, a prober includes a stage having a horizontal mounting surface that mounts thereon a substrate on which semiconductor devices are formed; and a probe card provided to face the stage. Further, the stage includes a motor and an elevating unit provided in a central portion of the mounting surface. Furthermore, the elevating unit is configured move up the substrate, and the motor is configured to rotate the elevating unit about a vertical rotational axis by a rotational driving force.

In still another example embodiment, a prober includes a stage having a horizontal mounting surface that mounts thereon a substrate on which semiconductor devices are formed; a probe card provided to face the stage; and a moving unit arranged above the stage and configured to be moved to face the stage. Further, the moving unit comprises a motor and an attracting member configured to attract and hold a central portion of the substrate, and the motor is configured to rotate the attracting member about a vertical rotational axis by a rotational driving force.

In still another example embodiment, a prober includes a stage having a horizontal mounting surface that mounts thereon a substrate on which semiconductor devices are formed; a probe card provided to face the stage; and a transfer arm configured to transfer the substrate onto the stage. Further, the transfer arm mounts thereon the substrate horizontally and comprises at least one roller configured to be rotated about a vertical rotational axis, and the at least one roller is configured to rotate the substrate on a horizontal plane while being in contact with a peripheral edge of the substrate.

According to the example embodiments, the rollers are provided along the circumference of the substrate and each of the rollers has the vertical rotational shaft. With this configuration, the rollers rotate the substrate on the horizontal plane while being in contact with the peripheral edge of the substrate. Accordingly, by keeping on rotating the rollers, the substrate can be rotated by a large angle on the horizontal plane. Thus, the substrate need not be transferred to the rotating table provided within the loader to be horizontally rotated. Therefore, it is possible to suppress the throughput in the inspection of the semiconductor devices on the substrate from being reduced.

According to the example embodiments, the rollers are provided along the circumference of the stage and each of the rollers has the vertical rotational shaft. With this configuration, the rollers rotate the stage on the horizontal plane while being in contact with the periphery edge of the stage. Accordingly, by keeping on rotating the rollers, the substrate along with the stage can be rotated by a large angle on the horizontal plane. Thus, the substrate need not be transferred to the rotating table provided within the loader to be horizontally rotated. Therefore, it is possible to suppress the throughput in the inspection of the semiconductor devices on the substrate from being reduced.

According to the example embodiments, the elevating unit configured to lift up the substrate is provided in the central portion of the mounting surface. Further, the elevating unit is rotated about the vertical rotational axis by the rotational driving force of the motor. Accordingly, by keeping on rotating the motor, the substrate can be rotated by a large angle, and the substrate need not be transferred onto the rotating table provided within the loader to be horizontally rotated. As a result, it is possible to suppress the throughput in the inspection of the semiconductor devices on the substrate from being reduced.

According to the example embodiments, the attracting member configured to attract and hold the central portion of the substrate is rotated about the vertical rotational axis by the rotational driving force of the motor. Accordingly, by keeping on rotating the motor, the substrate can be rotated by a large angle, and the substrate need not be transferred onto the rotating table provided within the loader to be horizontally rotated. As a result, it is possible to suppress the throughput in the inspection of the semiconductor devices on the substrate from being reduced.

According to the example embodiments, the rollers of the transfer arm rotate the substrate on the horizontal plane while being in contact with the peripheral edge of the substrate. Accordingly, by keeping on rotating the rollers, the substrate can be rotated by a large angle on the horizontal plane. That is, the substrate can be rotated by the large angle just by being mounted on the transfer arm without being transferred onto the rotating table within the loader. Therefore, the substrate need not be transferred onto the rotating table provided within the loader to be horizontally rotated, so that it is possible to suppress the throughput in the inspection of the semiconductor devices on the substrate from being reduced.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 2 is a perspective view schematically illustrating an internal configuration of a main body of the prober of FIG. 1;

FIG. 3A is a plane view of the stage and FIG. 3B is a side view of the roller device;

FIG. 4A is a plane view and FIG. 4B is a cross sectional view taken along a line IV-IV of FIG. 4A;

FIG. 6A is a plane view and FIG. 6B is a cross sectional view taken along a line VI-VI of FIG. 6A;

FIG. 7A is a plane view and FIG. 7B is a side view;

FIG. 11A is a plane view and FIG. 11B is a side view;

DETAILED DESCRIPTION

Figure 1:
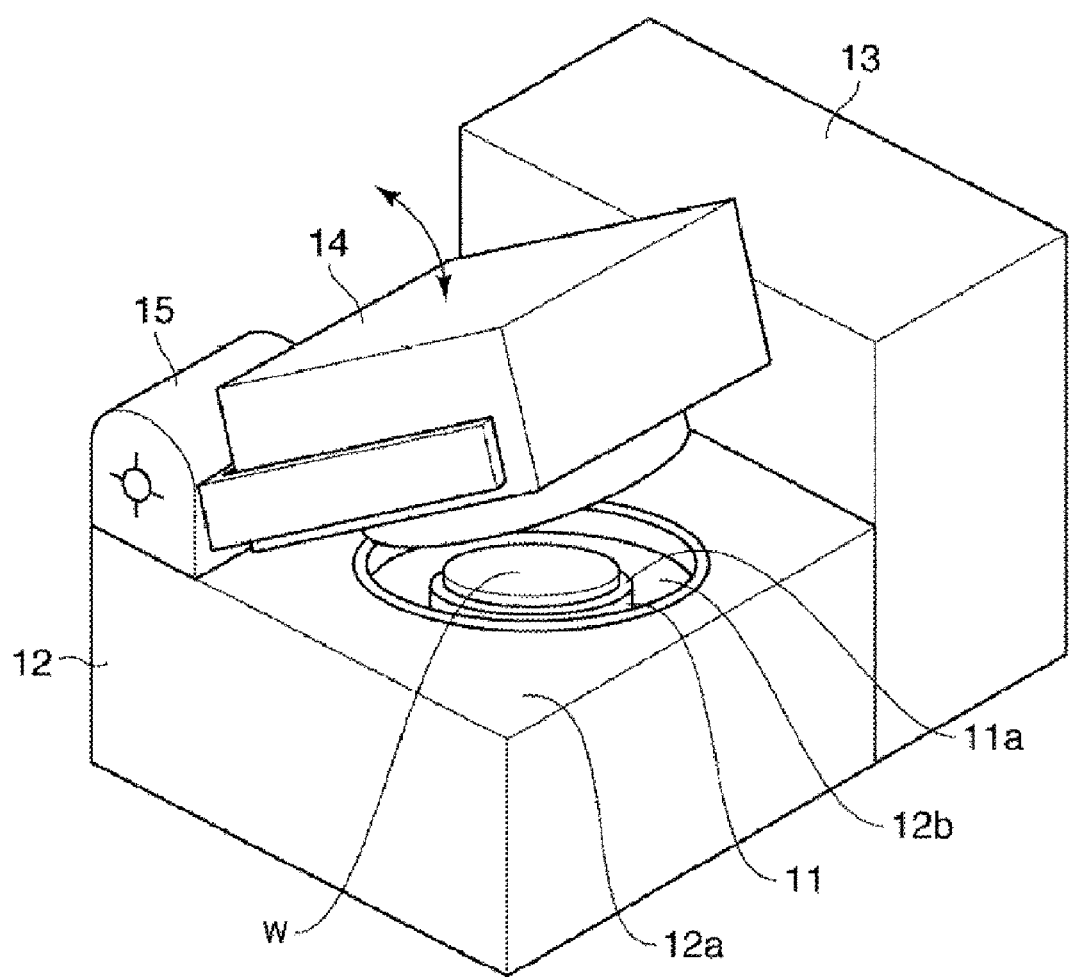
FIG. 1 is a perspective view schematically illustrating a configuration of a prober in accordance with a first example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, example embodiments will be described in detail with reference to the accompanying drawings, which form a part of the description.

First, a prober in accordance with a first example embodiment will be described.

FIG. 1 is a perspective view schematically illustrating a prober in accordance with the first example embodiment.

In FIG. 1, a prober 10 includes a main body 12 incorporating therein a substantially cylindrical stage 11 configured to mount a wafer W thereon; a loader 13 provided adjacent to the main body 12; and a test head 14 disposed to cover the main body 12. The prober 10 is configured to inspect electrical characteristics of semiconductor devices formed on a wafer W having a larger diameter of, e.g., 300 mm or 450 mm.

The main body 12 has a hollow housing shape. An opening 12b is formed at a ceiling portion 12a of the main body 12 to be opened above a wafer W mounted on the stage 11. A substantially circular plate-shaped probe card holder (not shown) is fitted into the opening 12b, and the probe card holder holds a circular plate-shaped probe card 16 (see FIG. 2). The stage 11 has a horizontal mounting surface 11a at the top thereof, and the wafer W is mounted on the mounting surface 11a. The probe card 16 faces the wafer W mounted on the mounting surface 11a.

The test head 14 has a hexahedral shape and is configured to be rotated upwards by a hinge device 15 provided on the main body 12. When the test head 14 covers the main body 12, the test head 14 is electrically connected with the probe cad 16 through a contact ring (not shown) therebetween. Further, the teat head 14 includes a data storage unit and a determination unit (both are not shown). The storage unit stores therein electric signals, which are outputted from the probe card 16 and indicate electrical characteristics of a semiconductor device, as measurement data. The determination unit determines, based on the measurement data, whether there exists an electrical defect of the semiconductor devices of the wafer W which is a target of inspection.

The loader 13 is configured to take out the wafer W having the semiconductor devices formed thereon from a FOUP (not shown) as a transfer container and mount the wafer W on the stage 11 of the main body 12. Further, the loader 13 is also configured to take out the wafer W, on which the inspection for the electrical characteristics of the semiconductor devices is completed, from the stage 11 and return the wafer W back into the FOUP. The loader 13 is equipped with a rotating table (not shown) configured to rotate the wafer W horizontally.

The probe card 16 has a multiple number of probe needles (not shown) arranged on a surface thereof facing the stage 11. The stage 11 is configured to adjust the relative position between the probe card 16 and the wafer W, so that the electrode pads of the semiconductor devices are brought into contact with the probe needles, respectively.

When the electrode pads of the semiconductor devices are brought into contact with the corresponding probe needles, the test head 14 allows an electric current for inspection to be flown into the semiconductor devices through the probe needles. Then, the probe card 16 outputs electric signals indicating the electrical characteristics of the semiconductor devices to the data storage unit of the test head 14. The data storage unit stores the received electric signals as measurement data, and the determination unit determines, based on the stored measurement data, whether there exists an electric defect of the semiconductor devices as the inspection target.

FIG. 2 is a perspective view schematically illustrating an internal configuration of the main body of the prober of FIG. 1.

In FIG. 2, the stage 11 is supported by a Y-direction moving unit 18 configured to be moved along a Y-direction defined in FIG. 2; an X-direction moving unit 19 configured to be moved along an X-direction defined in FIG. 2; and a Z-direction moving unit 20 configured to be moved along a Z-direction defined FIG. 2. As a result, the stage 11 can be moved toward the probe card 16.

The Y-direction moving unit 18 is moved in the Y-direction with high precision by rotating a ball screw (not shown) provided along the Y-direction, and the ball screw is rotated by a Y-direction moving unit motor (not shown) which is a step motor. The X-direction moving unit 19 is moved in the X-direction with high precision by rotating a ball screw 19a provided along the X-direction. The ball screw 19a is rotated by an X-direction moving unit motor as a step motor (not shown).

In the present example embodiment, the Y-direction moving unit 18, the X-direction moving unit 19 and the Z-direction moving unit 20 are capable of moving the stage 11 in the Y-X-and Z-directions of FIG. 2, respectively, so that the stage 11 mounting the wafer W thereon is moved to face the probe card 16. Especially, the Z-direction moving unit 20 moves the stage 11 toward the probe card 16 along the Z-direction of FIG. 2, so that electrode pads of the semiconductor devices on the wafer W are brought into contact with the corresponding probe needles, respectively.

Within the main body 12, a probe card holder guide 21 is provided adjacent to the stage 11. The probe card holder guide 21 has a bifurcated fork 22 capable of hold thereon the probe card holder configured to hold the probe card 16. The probe card holder guide 21 is configured to be moved in the Y and Z-directions of FIG. 2 and is used when replacing the probe cards 16.

Within the main body 12, an ASU camera 23 and a needle-tip polishing unit 24 are provided between the stage 11 and the probe card holder guide 21. Further, an alignment bridge 25 (moving member) is provided above the stage 11.

The ASU camera 23 and the needle-tip polishing unit 24 are fastened to the stage 11 and configured to be moved along with the stage 11 in the Y-, X-and Z-directions of FIG. 2. The alignment bridge 25 is configured to be moved in the Y-direction of FIG. 2, facing the stage 11 and the ASU camera 23.

The ASU camera 23 checks an accurate arrangement position of the stage 11 within the main body 12 by detecting a position mark (not shown) formed on the alignment bridge 25. The needle-tip polishing unit 24 is moved toward the probe card 16 and polishes tips of the individual probe needles of the probe card 16.

Figure 3A:
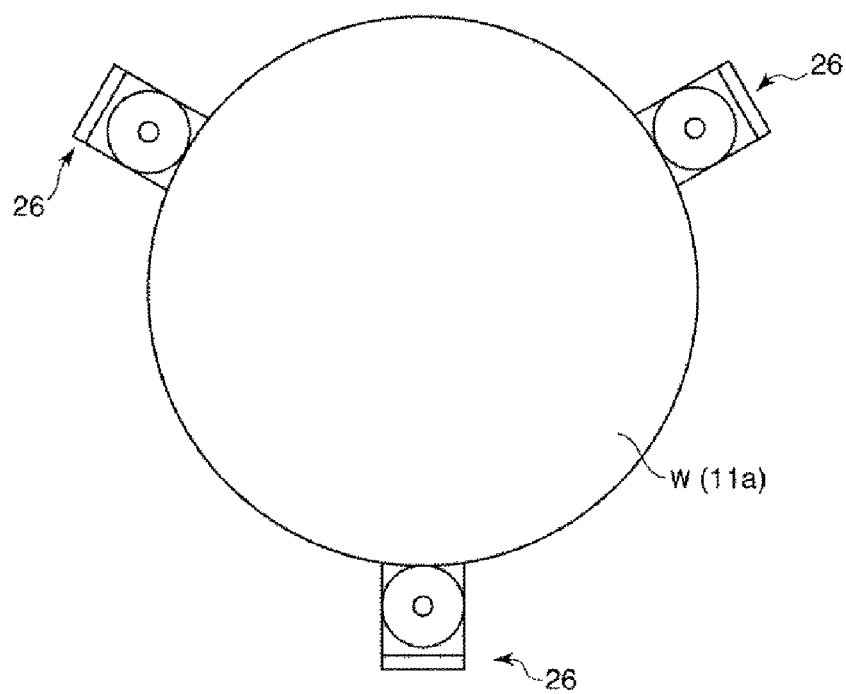
FIG. 3A and FIG. 3B are diagrams for describing roller devices provided along a circumference of a stage shown in FIG. 2.

Three roller devices 26, each having a vertical rotational axis (Z-directional rotational axis), are arranged along the circumference of the top surface of the stage 11 to surround the wafer W mounted on the mounting surface 11a. To elaborate, as depicted in FIG. 3A, the roller devices 26 are equally-spaced (at a pitch of 120°) along a circumference, which is concentric with the wafer W, on a horizontal plane (a plane extended along the X- and Y-directions of FIG. 2).

Figure 3B:
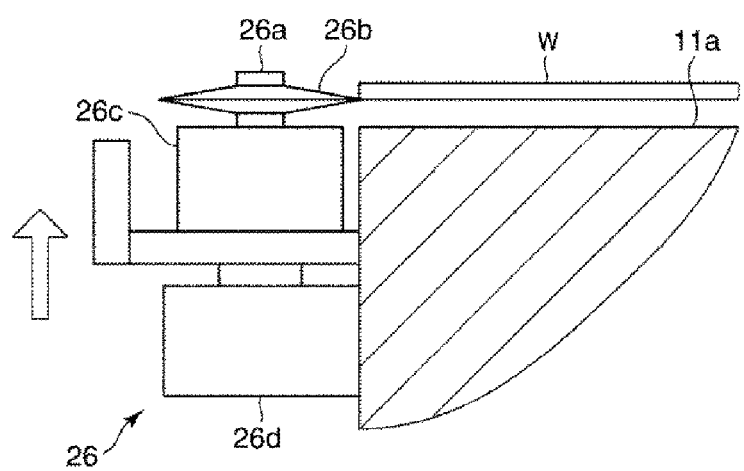

Each roller device 26 includes, as depicted in FIG. 3B, a vertical central shaft 26a; a circular plate-shaped roller 26b fastened to a periphery of the central shaft 26a and configured to be rotated about the vertical rotational axis along with the central shaft 26a; a motor 26c configured to apply a rotational driving force to the central shaft 26a; and a lifter 26d fastened to a side surface of the stage 11 and configured to lift up the motor 26c along with the central shaft 26a and the roller 26b in a direction (Z-direction) indicated by an arrow of FIG. 3B.

The roller 26b of the roller device 26 has a cross section which is tapered toward a periphery thereof. A substantially peripheral edge portion of the roller 26b is in contact with a peripheral edge of the wafer W.

In the present example embodiment, when rotating the wafer W horizontally in order to perform plural kinds of inspections on the semiconductor devices, the lifter 26d of each roller device 26 lifts up the roller 26b. Since the three rollers 26b are in contact with the peripheral edge of the wafer W, the wafer W along with the three rollers 26b is also lifted up.

Thereafter, the motor 27c applies a rotational driving force to the central shaft 26a, so that the roller 26b along with the central shaft 26b is rotated about the vertical rotational axis. Through the rotation of the roller 26b, the wafer W is also rotated about a vertical rotational axis, i.e., horizontally rotated. At this time, by keeping on rotating the motor 26c, the wafer W can be rotated by a large angle (equal to or larger than 180°) on the horizontal plane. Thus, the wafer W need not be transferred to the rotating table provided within the loader 13 in order to horizontally rotate the wafer W by the large angle. As a result, it is possible to suppress the throughput in the inspection of the semiconductor devices on the wafer W from being reduced.

Further, in the present example embodiment, since the three rollers 26b are equally-spaced along the circumference of the wafer W, the wafer W being rotated by the rollers 26b can be stably supported by the rollers 26b. Thus, the wafer W can be horizontally rotated in a stable manner.

Now, a prober in accordance with a second example embodiment will be described.

A configuration and an operation of the prober of the second example embodiment are basically the same as those of the first example embodiment. Thus, redundant description of the same configuration and operation will be omitted, and only distinctive configuration and operation will be elaborated.

Figure 4A:
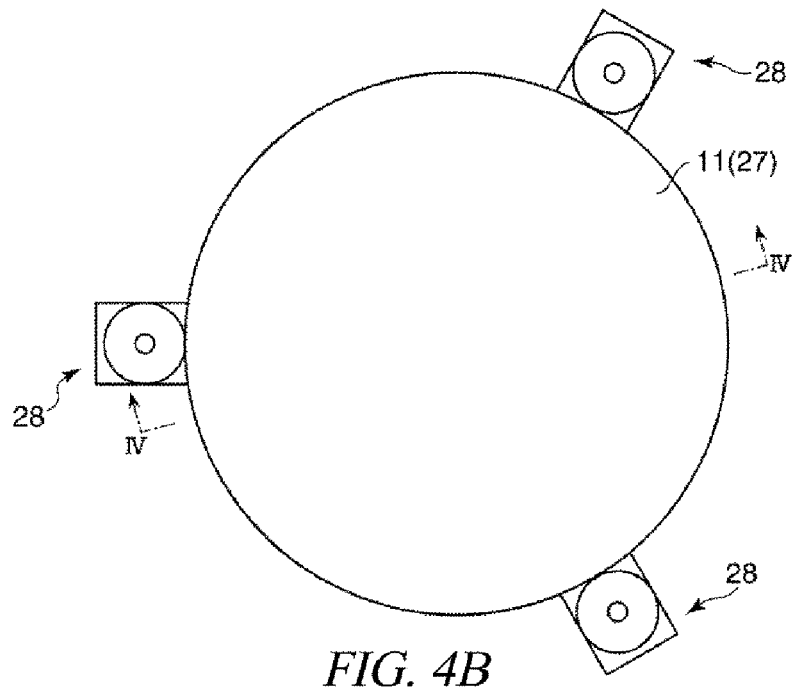
FIG. 4A and FIG. 4B are diagrams schematically illustrating a configuration of a stage of a prober in accordance with a second example embodiment.
Figure 4B:
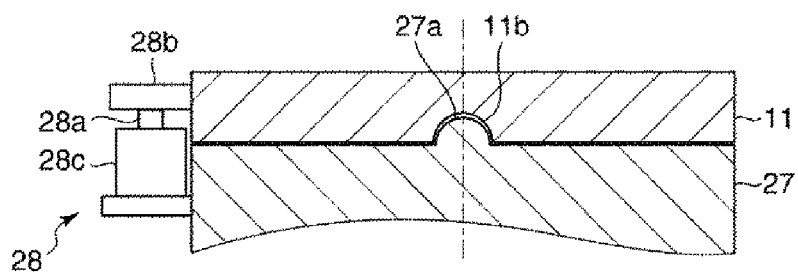

FIG. 4A and FIG. 4B are diagrams schematically illustrating a configuration of a stage of the prober in accordance with the second example embodiment. FIG. 4A is a plane view, and FIG. 4B is a cross sectional view taken along a line IV-IV of FIG. 4A.

In FIG. 4A and FIG. 4B, a cylindrical base 27 is provided between a stage 11 and a Z-direction moving unit 20, and the stage 11 is supported on the base 27 to be rotated horizontally. To elaborate, the stage 11 has a hemispherical recess 11b at a central portion of a surface (bottom surface) thereof facing the base 27, and the base 27 has a hemispherical protrusion 27a at a central portion of a surface (top surface) thereof facing the stage 11. The protrusion 27a is movably fitted into the recess 11b with a clearance therebetween. Accordingly, the stage 11 can be horizontally rotated independently from the base 27.

When the stage 11 is horizontally rotated independently from the base 27, air is supplied into the clearance between the stage 11 and the base 27, so that the stage 11 is levitated from the base 27 by the air. Meanwhile, when the position of the stage 11 is fixed to the base 27, the stage 11 is vacuum-attracted to the base 27.

Further, three roller devices 28, each having a vertical rotational axis (Z-directional rotational axis), are arranged to surround the stage 11. To elaborate, as depicted in FIG. 4A, the roller devices 28 are equally-spaced (at a pitch of 120°) on a circumference concentric with stage 11 on a horizontal plane.

Each roller device 28 includes, as depicted in FIG. 4B, a vertical central shaft 28a; a flat circular plate-shaped roller 28b fastened to a periphery of the central shaft 28a and configured to be rotated about the vertical rotational axis along with the central shaft 28a; and a motor 28c configured to apply a rotational driving force to the central shaft 28a. A peripheral edge portion of the roller 28b is in contact with a peripheral edge of the stage 11.

In the present example embodiment, to rotate the wafer W horizontally, the motor 28c applies the rotational driving force to the central shaft 28a, so that the roller 28b along with the central shaft 28a is rotated about a vertical rotational axis. Through the rotation of the roller 28b, the stage 11 is also rotated horizontally. At this time, by keeping on rotating the motor 28c, the stage 11 and the wafer W mounted on the mounting surface 11a of the stage 11 can be rotated by a large angle on the horizontal plane. Thus, the wafer W need not be transferred to the rotating table provided within the loader 13 to be horizontally rotated by the large angle. Therefore, it is possible to suppress the throughput in the inspection of the semiconductor devices on the wafer W from being reduced.

Further, in this present example embodiment, since the three rollers 28b are equally-spaced along the circumference of the stage 11, the stage 11, which is configured to be rotated by the rollers 28b, can be horizontally rotated in a stable manner.

Furthermore, in the present example embodiment, the protrusion 27a of the base 27 is movably fitted into the recess 11b of the stage 11 with the clearance therebetween, and the stage 11 is levitated from the base 27. Accordingly, a rolling friction that may be generated during the horizontal rotation of the stage 11 can be reduced, so that the stage 11 can be smoothly rotated on the horizontal plane.

Figure 5:
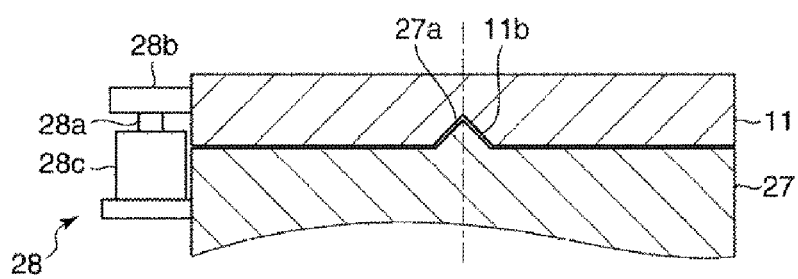
FIG. 5 is a cross sectional view schematically illustrating a configuration of a first modification example of the stage of the prober in accordance with the second example embodiment.

In the above-described second example embodiment, both the protrusion 27a and the recess 11b have the hemispherical shapes. However, the shapes of the protrusion 27a and the recess 11b may not be limited thereto. By way of non-limiting example, the protrusion 27a and the recess 11b may have conical shapes, as depicted in FIG. 5. In such a case, the protrusion 27a can also be movably fitted into the recess 11b with a clearance therebetween.

Further, in the above example embodiment, the stage 11 is levitated from the base 27 by supplying air. Instead, however, an electromagnet may be embedded in the base 27. When the stage 11 is horizontally rotated independently from the base 27, the stage 11 is move up from the base 27 by a repulsive force caused by a magnetic force. When the position of the stage 11 is fixed to the base 27, the stage 11 is attracted to and held on the base 27 by an attracting force caused by the magnetic force.

Figure 6A:
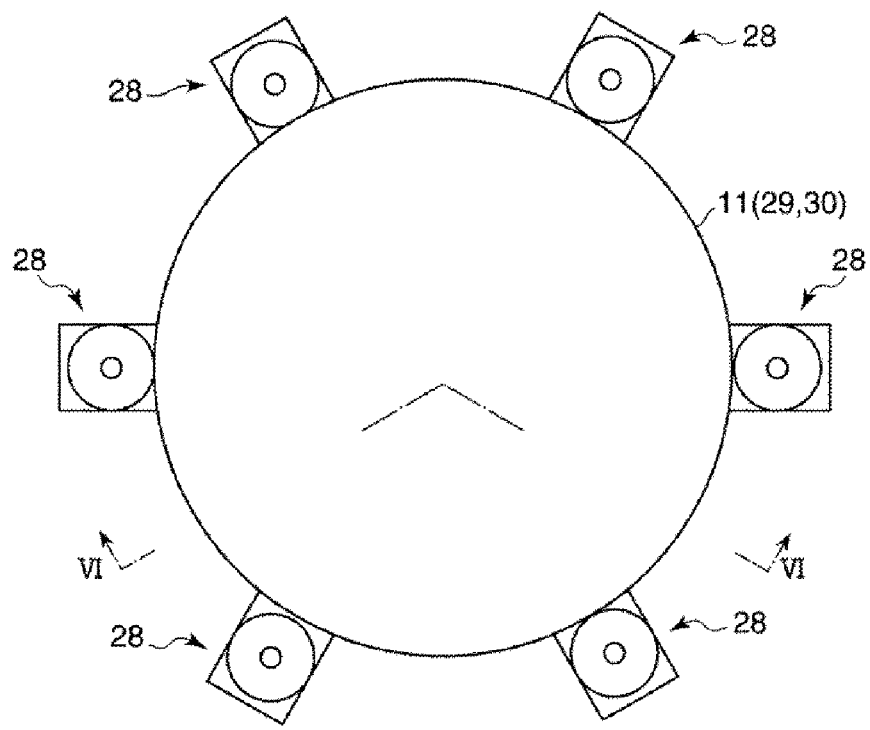
FIG. 6A and FIG. 6B are diagrams schematically illustrating a configuration of a second modification example of the stage of the prober in accordance with the second example embodiment.
Figure 6B:
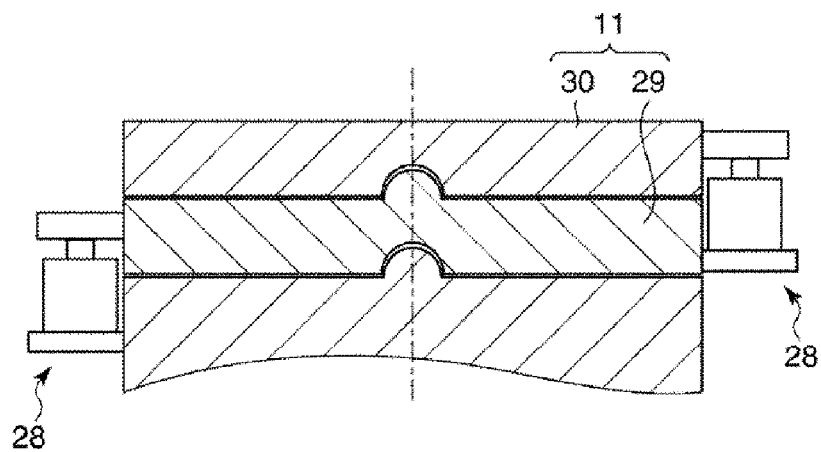

Moreover, in the above-described second example embodiment, the stage 11 is composed of a single member. However, the stage 11 may be composed of two circular plate-shaped members 29 and 30 which are vertically stacked on top of each other and configured to be independently rotated on the horizontal plane, as shown in FIG. 6A and FIG. 6B. In such a configuration, three roller devices 28 are arranged at a pitch of 120° along a circumference of the lower member 29 on a horizontal plane, and three roller devices 28 are also arranged at a pitch of 120° along a circumference of the upper member 30 on a horizontal plane. In each of the roller devices 28 provided along the circumference of the lower member 29, a motor 28c is rotated about a central shaft 28a at a high speed, and in each of the roller devices 28 provided along the circumference of the upper member 30, a motor 28c is rotated about a central shaft 28a at a low speed with high precision. Accordingly, the rollers 28b of the respective roller devices 28 around the lower member 29 rapidly rotate the lower member 29 by a large rotational angle, whereas the rollers 28b of the respective roller devices 28 around the upper member 30 precisely rotate the upper member 30.

At this time, if the rollers 28b of the individual roller devices 28 around the lower member 29 and the rollers 28b of the individual roller devices 28 around the upper member 30 are rotated at the same time, the stage 11 and the wafer W mounted on the mounting surface 11a of the stage 11 can be horizontally rotated by a required rotational angle rapidly and precisely.

Now, a prober in accordance with a third example embodiment will be discussed.

A configuration and an operation of the prober of the third example embodiment are basically the same as those of the first example embodiment. Thus, redundant description of the same configuration and operation will be omitted, and only distinctive configuration and operation will be elaborated.

Figure 7A:
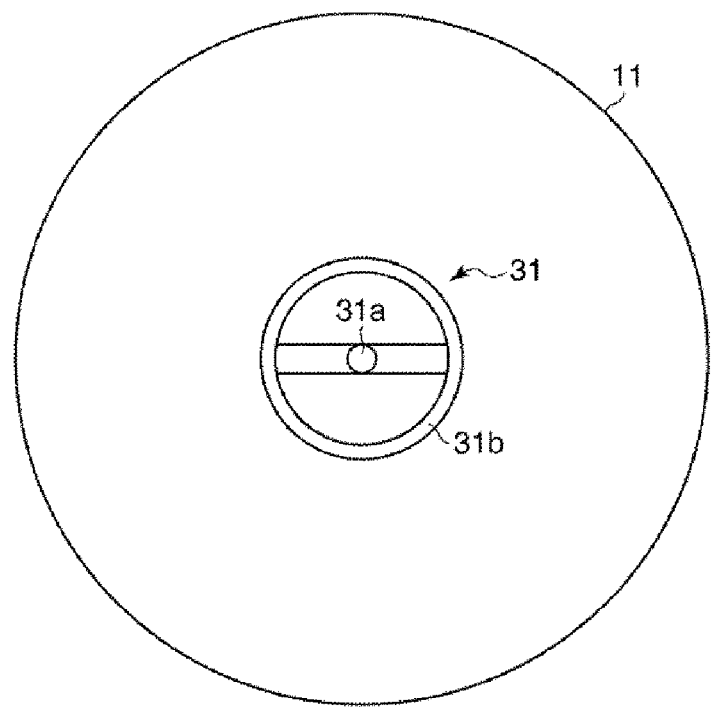
FIG. 7A and FIG. 7B are diagrams schematically illustrating a configuration of a stage of a prober in accordance with a third example embodiment.
Figure 7B:
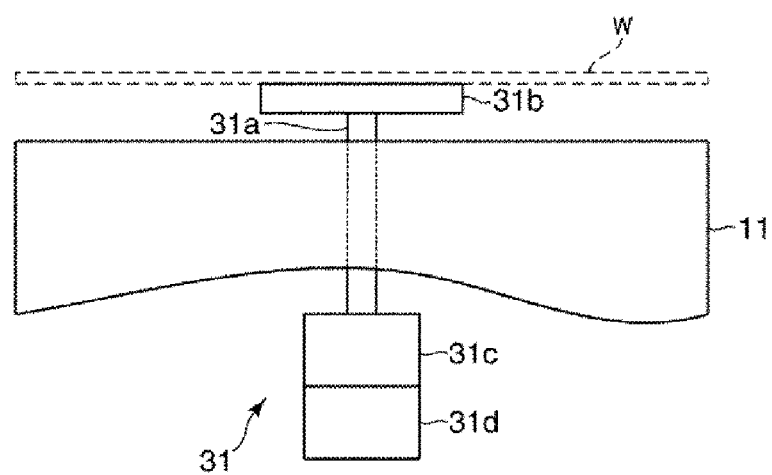

FIG. 7A and FIG. 7B are diagrams schematically illustrating a configuration of a stage of the prober in accordance with the third example embodiment. FIG. 7A is a plane view, and FIG. 7B is a side view.

In FIG. 7A and FIG. 7B, an elevating unit 31 (elevating device) configured to lift up the wafer W mounted on the mounting surface 11a is provided in a central portion of the mounting surface 11a of the stage 11. The elevating unit 31 includes a vertical central shaft 31a; a supporting member 31b as a ring-shaped member connected to the central shaft 31a and configured to be brought into contact with a rear surface of the wafer W (indicated by a dashed line in FIG. 7B); a motor 31c configured to apply a rotational driving force to the central shaft 31a; and a lifter 31d configured to move the central shaft 31a up and down in a vertical direction. When viewed from the top, a center of the supporting member 31b coincides with a center of the wafer W.

In the present third example embodiment, to rotate the wafer W horizontally, the lifter 31d first lifts up the central shaft 31a. At this time, the wafer W along with the supporting member 31b is raised up.

Thereafter, the motor 31c applies a rotational driving force to the central shaft 31a, so that the central shaft 31a is rotated about a vertical rotational axis. Through the rotation of the central shaft 31a, the wafer W is also rotated horizontally. At this time, by keeping on rotating the motor 31c, the wafer W can be rotated by a large angle on a horizontal plane. Accordingly, the wafer W need not be transferred to the rotating table provided within the loader 13 to be horizontally rotated by the large angle. Thus, it is possible to suppress the throughput in the inspection of semiconductor devices of the wafer W from being reduced.

Further, in the present example embodiment, since the supporting member 31b to be brought into contact with the rear surface of the wafer W is composed of the ring-shaped member, the supporting member 31b is capable of supporting the wafer W stably. Further, rotating mass can be decreased, so that a load on the motor 31c can be reduced.

Now, a prober in accordance with a fourth example embodiment will be explained.

A configuration and an operation of the prober of the fourth example embodiment are also basically the same as those of the first example embodiment. Thus, redundant description of the same configuration and operation will be omitted, and only distinctive configuration and operation will be elaborated.

Figure 8:
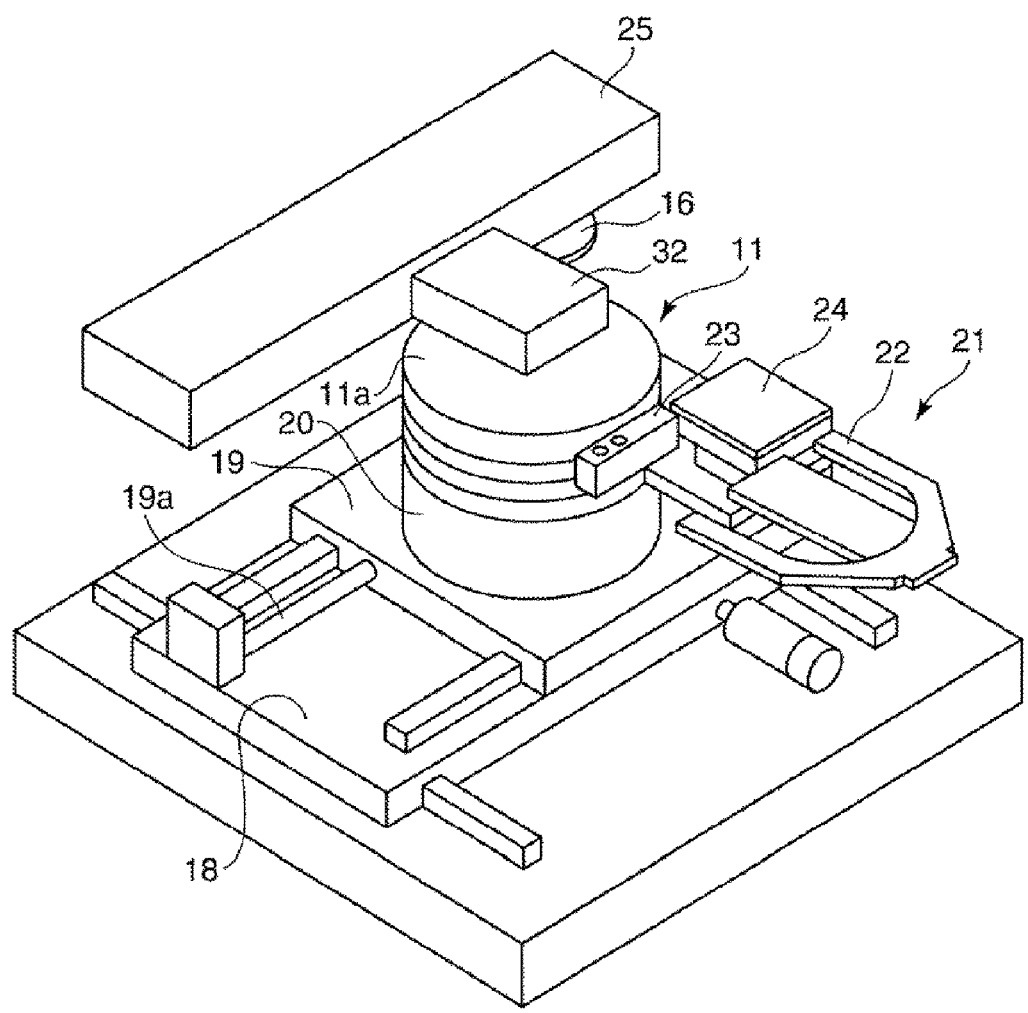
FIG. 8 is a perspective view schematically illustrating an internal configuration of a main body of a prober in accordance with a fourth example embodiment.
Figure 8:
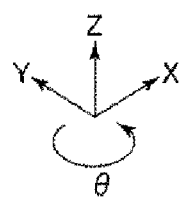
Figure 9A:
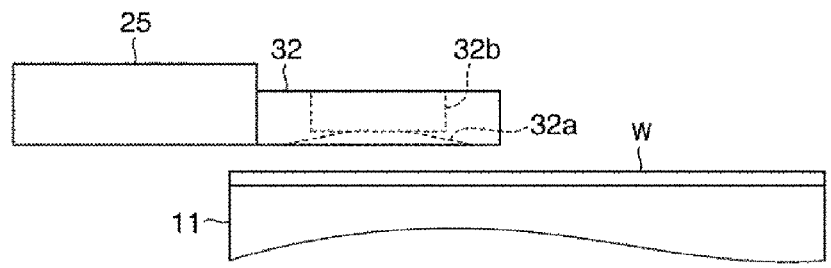
FIG. 9A to FIG. 9D are process diagrams for describing a horizontal rotation process for a wafer performed by a wafer rotating unit of FIG. 8.
Figure 9B:
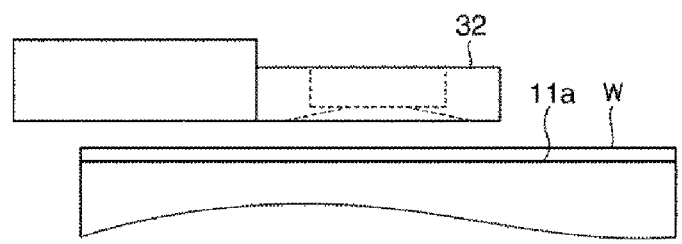

FIG. 8 is a diagram schematically illustrating an internal configuration of a main body of the prober in accordance with the fourth example embodiment In FIG. 8, an alignment bridge 25 has a wafer rotating unit 32 protruded sideways, and the wafer rotating unit 32 includes, as depicted in FIG. 9A to be described later, a chuck 32a (attracting member) configured to attract and hold a central portion of the wafer W; a motor 32b provided on the chuck 32a; and a lifter (not shown) configured to move the chuck 32a up and down in a vertical direction. The motor 32b is arranged on the same axis with the chuck 32a in the vertical direction. The motor 32b is configured to apply a rotational driving force to the chuck 32a, so that the chuck 32a is rotated about a vertical rotational axis.

FIG. 9A to FIG. 10C are process diagrams for describing the horizontal rotation process for the wafer, which is performed by the wafer rotating unit of FIG. 8.

Figure 9C:
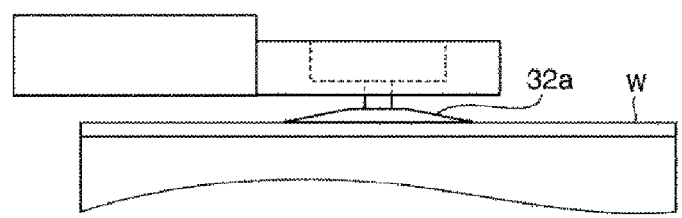

First, the alignment bridge 25 is moved toward a position above the stage 11 (FIG. 9A). If the wafer rotating unit 32 is positioned to face the wafer W mounted on the mounting surface 11a (FIG. 9B), the lifter lowers the chuck 32a and brings the chuck 32a into contact with a central portion of the wafer W (FIG. 9C).

Figure 9D:
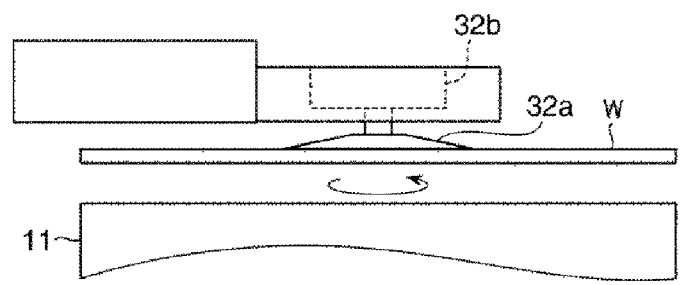

Then, with the wafer W attracted and held by the chuck 32a, the Z-directional moving unit 20 lowers the stage 11 to separate the wafer W from the stage 11 (FIG. 9D).

Thereafter, the motor 32b rotates the chuck 32a about a vertical rotational shaft by applying the rotational driving force to the chuck 32a. At this time, since the wafer W is attracted to and held by the chuck 32a, the wafer W is also rotated. Here, by keeping on rotating the motor 32b, the wafer W can be rotated by a large angle on a horizontal plane.

Figure 10A:
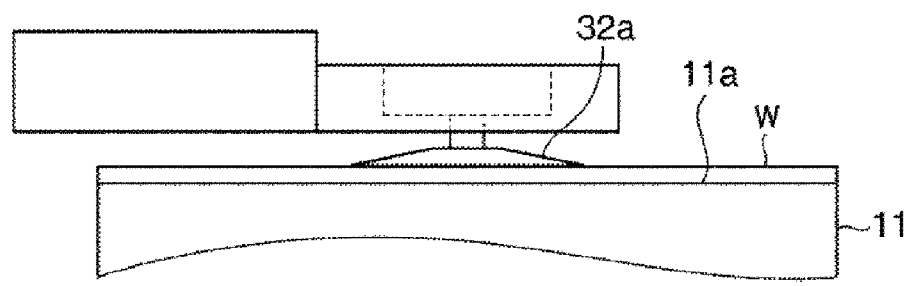
FIG. 10A to FIG. 10C are process diagrams for describing the horizontal rotation process of the wafer performed by the wafer rotating unit of FIG. 8.
Figure 10B:
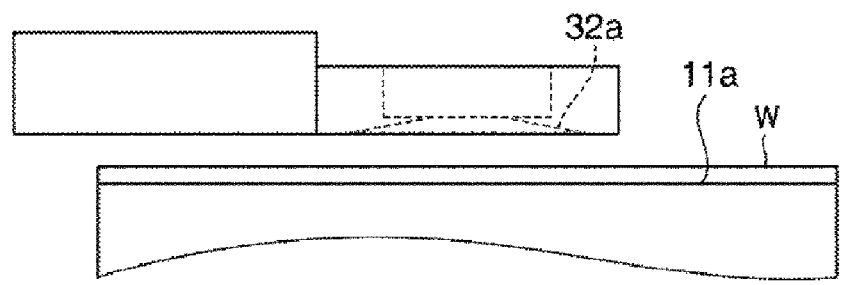
Figure 10C:
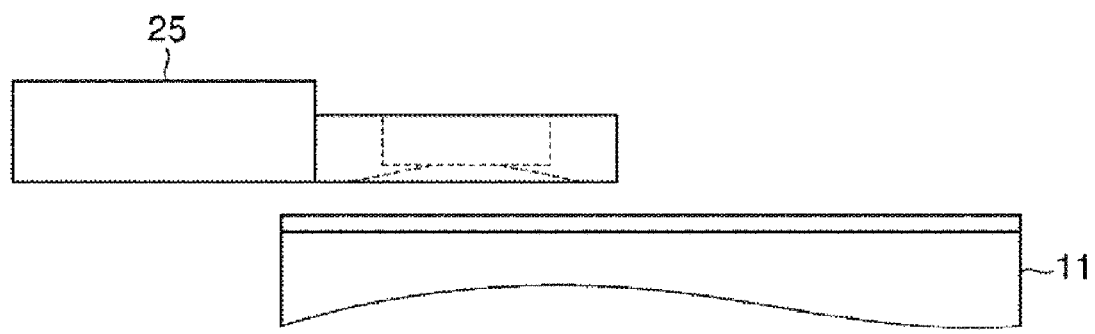

After the wafer W is horizontally rotated by a required angle, the Z-directional moving unit 20 raises the stage 11, so that the mounting surface 11a is brought into contact with the wafer W (FIG. 10A). Further, the chuck 32a is separated from the wafer W and then raised by the lifter, so that the wafer W is mounted on the mounting surface 11a (FIG. 10B).

Subsequently, the alignment bridge 25 is moved toward a retreat position from the position above the stage 11 (FIG. 10C), and the process is ended.

According to the processes depicted in FIG. 9A to FIG. 10C, since the chuck 32a that attracts and holds the central portion of the wafer W is rotated about the vertical rotational axis by the rotational driving force of the motor 32b, the wafer W can be rotated by a large angle by keeping on rotating the motor 32b. Thus, the wafer W need not be transferred onto the rotating table within the loader 13 to be horizontally rotated thereon. As a result, it is possible to suppress the throughput in the inspection of semiconductor devices of the wafer W from being reduced.

Furthermore, when the chuck 32a attracts and holds the wafer W, any one of vacuum attraction, electromagnetic attraction and electrostatic attraction may be employed.

Now, a prober in accordance with a fifth example embodiment will be discussed.

A configuration and an operation of the prober of the fifth example embodiment are also basically the same as those of the first example embodiment. Thus, redundant description of the same configuration and operation will be omitted, and only distinctive configuration and operation will be elaborated.

A prober 10 in the fifth example embodiment is equipped with a transfer arm 33 (see FIG. 11A and FIG. 11B) configured to transfer the wafer W onto the stage 11 from the loader 13.

Figure 11A:
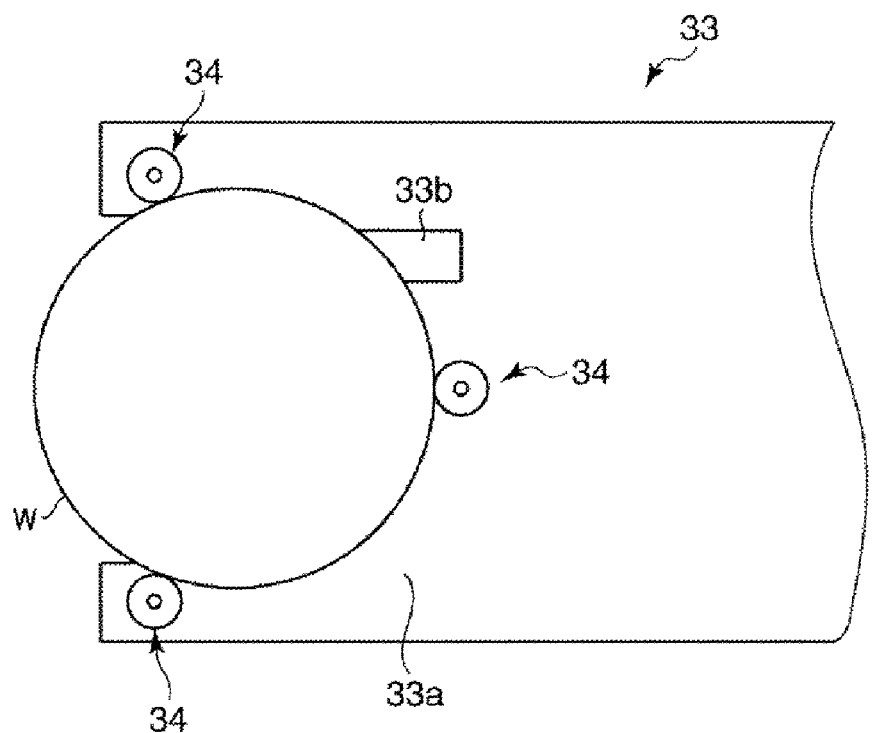
FIG. 11A and FIG. 11B are diagrams schematically illustrating a configuration of a transfer arm of a prober in accordance with a fifth example embodiment.

The transfer arm 33 is mad composed e of an elongated plate-shaped member and is configured to mount the wafer W on a top surface 33a thereof in a horizontally rotatable manner. Three rollers 34, each configured to be rotated about a vertical rotational axis, are arranged along the circumference of the wafer W to surround the wafer W mounted on the top surface 33a. To elaborate, as depicted in FIG. 11A, the rollers 34 are equally-spaced along the circumference of the wafer W on a horizontal plane. A peripheral edge portion of each roller 34 is in contact with a peripheral edge of the wafer W.

In the present fifth example embodiment, when horizontally rotating the wafer W in order to perform plural kinds of inspections on the semiconductor devices on the wafer W, the transfer arm 33 first receives the wafer W from the stage 11. Then, by rotating the respective rollers 34 about vertical rotational axes thereof, the wafer W is horizontally rotated. At this time, by keeping on rotating the rollers 34, the wafer W can be rotated by a large angle on the horizontal plane. That is, just by allowing the wafer W to be mounted on the transfer arm 33 without being transferred onto the rotating table provided within the loader 13, the wafer W can be horizontally rotated by the large angle. Accordingly, since the wafer W need not be transferred onto the rotating table within the loader 13, it is possible to suppress the throughput in the inspection of the semiconductor devices of the wafer W from being reduced.

Further, in the present example embodiment, since the three rollers 34 are equally-spaced along the circumference of the wafer W, the wafer W can be horizontally rotated by the rollers 34 in a stable manner.

Figure 11B:
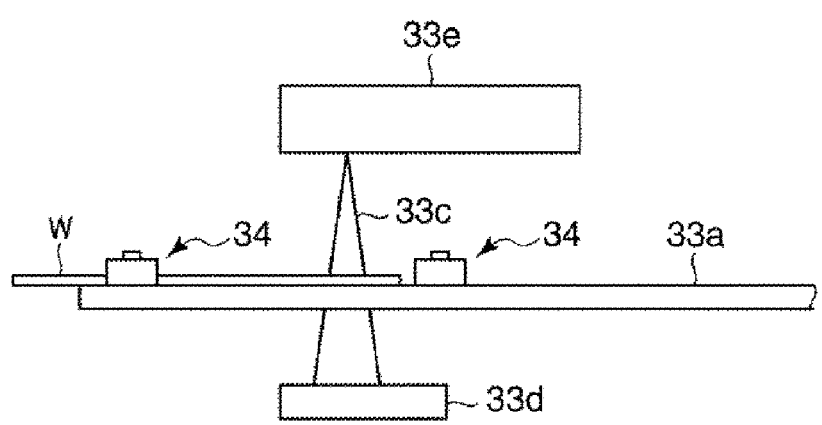
Figure 12:
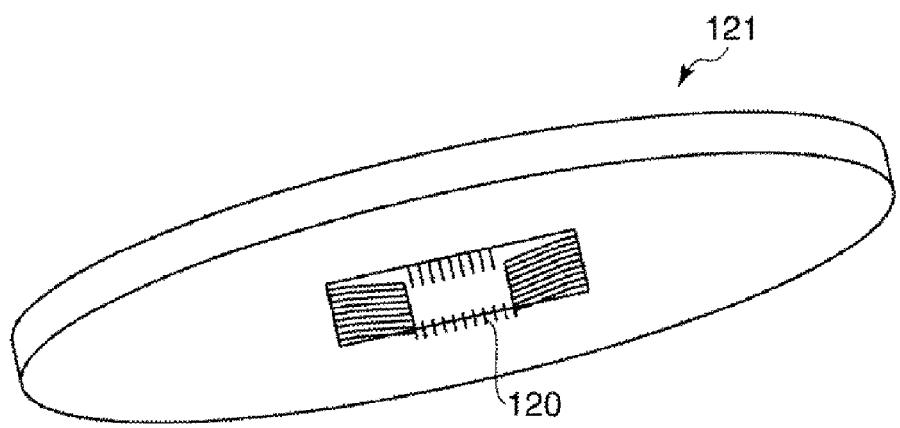
FIG. 12 is a perspective view schematically illustrating a configuration of a probe card.
Figure 13A:
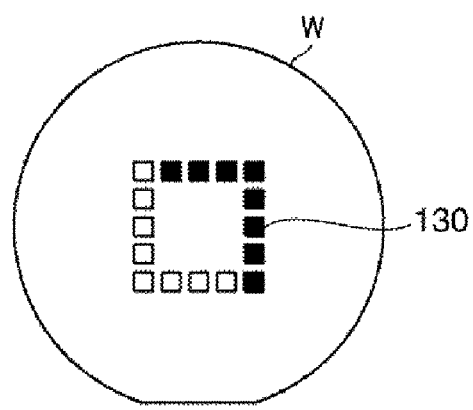
FIG. 13A and FIG. 13B are process diagrams for describing horizontal rotation of a wafer in inspecting semiconductor devices on the wafer.
Figure 13B:
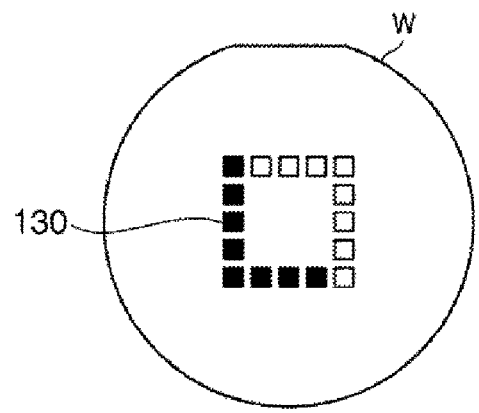

Moreover, in order to detect a rotation angle or position of the wafer W on the transfer arm 33 accurately, the transfer arm 33 may be provided with a notch window 33b at a position overlapped with a part of a periphery portion of the wafer W mounted on the top surface 33a. Further, a pre-alignment beam irradiator 33d configured to irradiate a LED beam 33c and a pre-alignment sensor 33e serving as a light receiver of the LED beam 33c are provided to face each other with the notch window 33b therebetween (FIG. 11B). In this case, a part of the LED light 33c is blocked by the periphery portion of the wafer W, and the remaining is received by the pre-alignment sensor 33e. Here, by measuring the degree of blocking the LED light 33c, the rotation angle or the position of the wafer W can be detected.

While the disclosure has been described with respect to the example embodiments, the present disclosure is not limited to the example embodiments.

By way of example, although the three roller devices 26, the three roller devices 28 and the three rollers 34 are equally spaced along the circumference, the number of each of the roller devices 26, the roller devices 28 or the rollers 34 is not limited to three but may be at least one as long as the wafer W can be horizontally rotated without allowing the wafer W or the stage 11 to be moved in the X- or Y-direction.

In addition, as for the motor 26c, the motor 28c, the motor 31c and the motor 32b, the central shaft 26a, the central shaft 28a, the central shaft 31a and the chuck 32a may be rotated directly or may be rotated via cam gear train or the like.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A prober, comprising:
   a circular plate-shaped stage, having a horizontal mounting surface that mounts thereon a substrate on which semiconductor devices are formed, configured to be rotated on a horizontal plane;
   a probe card provided to face the stage; and
   at least one roller, having a vertical rotational shaft, arranged on a circumference of the stage,
   wherein the at least one roller is configured to rotate the stage on the horizontal plane while being in contact with a peripheral edge of the stage,
   the stage is supported on a base,
   the stage has a recess at a central portion of a surface thereof facing the base, and the base has a protrusion at a central portion of a surface thereof facing the stage, and
   the protrusion is movably fitted into the recess with a clearance therebetween.

2. The prober of claim 1,
   wherein the at least one roller is plural in number, and the rollers are equally-spaced along the circumference of the stage.

3. The prober of claim 1,
   wherein the stage comprises two circular plate-shaped members which are stacked on top of each other in a vertical direction and configured to be independently rotated on the horizontal plane,
   the at least one roller is plural in number, and
   one or more of the rollers configured to be rotated by a large angle are in contact with one of the two circular plate-shaped members, and the others of the rollers configured to precisely rotated are in contact with the other of the two circular plate-shaped members.

4. The prober of claim 1,
   wherein
   the recess is a hemispherical recess, and the protrusion is a hemispherical protrusion.

5. The prober of claim 1,
   wherein
   the recess is a conical recess, and the protrusion is a conical protrusion.

6. The prober of claim 4,
   wherein the stage is levitated from the base by air when the stage is rotated on the horizontal plane, and the stage is vacuum-attracted to the base when a position of the stage is fixed.

7. The prober of claim 4,
   wherein the stage is moved up from the base by a magnetic force when the stage is rotated on the horizontal plane, and the stage is attracted to the base by the magnetic force when a position of the stage is fixed.

* * * * *